United States Patent
Johansson

(10) Patent No.: US 7,649,488 B1
(45) Date of Patent: Jan. 19, 2010

(54) LOW-POWER COLUMN PARALLEL CYCLIC ANALOG-TO-DIGITAL CONVERTER

(75) Inventor: Robert Johansson, Oslo (NO)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 12/145,620

(22) Filed: Jun. 25, 2008

(51) Int. Cl.
*H03M 1/34* (2006.01)

(52) U.S. Cl. .................. 341/163; 341/155; 341/172; 341/161

(58) Field of Classification Search .............. 341/161, 341/155, 144, 163, 172, 120
See application file for complete search history.

(56) References Cited

U.S. PATENT DOCUMENTS

| | | | |
|---|---|---|---|
| 6,166,367 A | 12/2000 | Cho | |
| 6,480,132 B1 | 11/2002 | Yoshioka et al. | |
| 6,670,904 B1* | 12/2003 | Yakovlev | 341/167 |
| 6,870,495 B1* | 3/2005 | Zadeh et al. | 341/161 |
| 7,061,413 B2* | 6/2006 | Boemler | 341/120 |
| 7,173,557 B2 | 2/2007 | Kuttner | |
| 7,333,043 B2* | 2/2008 | Terzioglu | 341/172 |
| 7,345,615 B2 | 3/2008 | Kawahito | |
| 2005/0024524 A1 | 2/2005 | Yourlo et al. | |

OTHER PUBLICATIONS

Masanori Furuta et al., "A High-Speed, High-Sensitivity Digital CMOS Image Sensor with a Global Shutter and 12-bit Column-Parallel Cyclic A/D Converters", IEEE Journal of Solid-State Circuits, vol. 42, No. 4, Apr. 2007.

Mitsuhito Mase et al., "A Wide Dynamic Range CMOS Image Sensor with Multiple Exposure-Time Signal Outputs and 12-bit Column.—Parallel Cyclic A/D Converters", IEEE Journal of Solid-State Circuits, vol. 40, No. 12, Dec. 2005.

Column Cyclic A/D Converter: 1-stage column parallel cyclic ADC (http://www.idl.rie.shizuoka.ac.jp/study/project/column_cadc/index_e.html).

CMOS Image Sensors Capable of Time-Delayed Integration (NASA's Jet Propulsion Laboratory, Pasadena, CA, Apr. 1, 2001) (www.techbriefs.com/content/view/2221/10/-38k).

Christer Jansson, "A High-Resolution, Compact, and Low-Power ADC Suitable for Array Implementation in Standard CMOS", IEEE Transactions of Circuits and Systems—1: Fundamental Theory and Applications, vol. 32, No. 11, Nov. 1995.

* cited by examiner

*Primary Examiner*—Jean B Jeanglaude
(74) *Attorney, Agent, or Firm*—Dickstein Shapiro LLP

(57) ABSTRACT

A low-power column parallel cyclic analog-to-digital converter and an imaging device using the same. The analog-to-digital converter comprises one stage and is optimized to reduce power, noise and capacitor settling time. The one stage analog-to-digital converter comprises a multiplying circuit for performing a multiplication operation during conversion phases and a sub-analog-to-digital converter connected to receive analog output signals from the multiplying circuit. The sub-analog-to-digital converter converts, during the conversion phases, the analog output signals into portions of an N-bit digital code. The multiplying circuit switches configurations between conversion phases and uses the portions of the digital code during the conversion phases to generate new analog output signals for subsequent conversion by the sub-analog-to-digital converter.

25 Claims, 12 Drawing Sheets

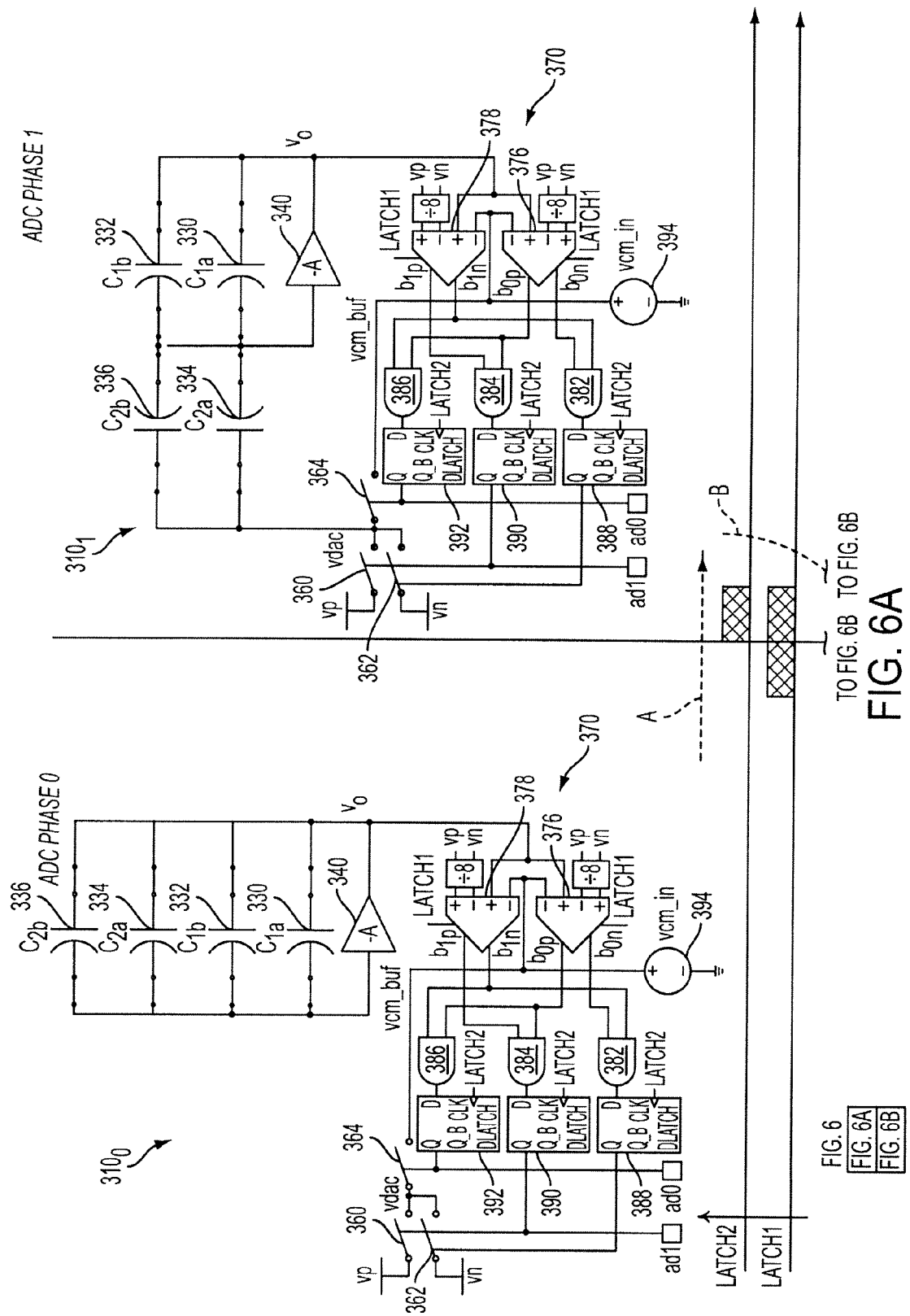

LOW-POWER COLUMN PARALLEL CYCLIC ANALOG-TO-DIGITAL CONVERTER

FIELD OF THE INVENTION

Embodiments of the invention relate to imagers and more particularly to cyclic analog-to-digital conversion techniques for imagers.

BACKGROUND

A CMOS imager includes a focal plane array of pixel circuits, each one of the pixels including a photosensor, for example, a photogate, photoconductor or a photodiode overlying a substrate for accumulating photo-generated charge in the underlying portion of the substrate. Each pixel has a readout circuit that includes at least an output field effect transistor formed in the substrate and a charge storage region formed on the substrate connected to the gate of an output transistor, typically a source follower transistor. The charge storage region may be constructed as a floating diffusion region. Each pixel may include at least one electronic device such as a transistor for transferring charge from the photosensor to the storage region and one device, also typically a transistor, for resetting the storage region to a predetermined charge level prior to charge transference. A row select transistor may also be employed to gate the pixel output.

In a CMOS imager, the active elements of a pixel perform the necessary functions of: (1) photon to charge conversion; (2) accumulation of image charge; (3) resetting the storage region to a known state; (4) selection of a pixel for readout; and (5) output and amplification of a signal representing pixel charge. The charge at the storage region is typically converted to a pixel output voltage by the capacitance of the storage region and a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc.

FIG. 1 illustrates a block diagram for a CMOS imager 10. The imager 10 includes a pixel array 20. The pixel array 20 comprises a plurality of pixels arranged in a predetermined number of columns and rows. The pixels of each row in array 20 are all turned on at the same time by a row select line and the pixel signals of each column are selectively output onto output lines by a column select line. A plurality of row and column select lines are provided for the entire array 20.

The row lines are selectively activated by the row driver 32 in response to row address decoder 30 and the column select lines are selectively activated by the column driver 36 in response to column address decoder 34. Thus, a row and column address is provided for each pixel. The CMOS imager 10 is operated by the control circuit 40, which controls the address decoders 30, 34 for selecting the appropriate row and column select lines for pixel readout, and row and the column driver circuitry 32, 36, which apply driving voltage to the drive transistors of the selected row and column select lines.

Each column contains readout and correlated double sampling (CDS) circuitry 38 associated with the column driver 36 that reads a pixel reset signal $V_{rst}$ and a pixel image signal $V_{sig}$ for selected pixels of each column. A differential signal (e.g., $V_{rst}-V_{sig}$) is produced by differential amplifiers contained in the readout and correlated double sampling circuitry 38 for each pixel and is digitized by an analog-to-digital converter 100 (ADC). The analog-to-digital converter 100 supplies the digitized pixel signals to an image processor 50, which forms a digital image output.

The signals output from the pixels of the array 20 are analog voltage signals. These signals must be converted from analog to digital for further processing. Thus, the analog signals are sent to the analog-to-digital converter 100. In a column parallel readout architecture, each column is connected to its own respective analog-to-digital converter 100.

There are many different types of analog-to-digital converters that may be used in an imager 10. One well known analog-to-digital converter is a cyclic analog-to-digital converter. A conceptual diagram of a cyclic analog-to-digital converter 100 is illustrated in FIG. 2. In the illustrated example, the cyclic analog-to-digital converter 100 contains two stages 101, 111. The first stage 101 includes a sample and hold circuit (S&H) 102, a sub-ADC 104 (e.g., a flash converter with a few output bits), a digital-to-analog converter (DAC) 106, a summation circuit 108 and a multiplier 110 (e.g., an amplifier). The input of the sample and hold circuit 102 is connected to a switch 103; in one switch position, the input of the sample and hold circuit 102 is connected to an analog input voltage $V_{IN}$ and in a second switch position, the input of the sample and hold circuit 102 is connected to the output of the second stage 111. The switch 103 is controlled by a START signal. The output of the sample and hold circuit 102 is connected to a positive input of the summation circuit 108 and the input of the sub-ADC 104. The output of the sub-ADC 104 is connected to the digital-to-analog converter 106. The output of the digital-to-analog converter 106 is connected to a negative input of the summation circuit 108. The output of the summation circuit 108 is connected to the multiplier 110.

The second stage 111 includes a sample and hold circuit (S&H) 112, a sub-ADC 114 (e.g., a flash converter with a few output bits), a digital-to-analog converter (DAC) 116, a summation circuit 118 and a multiplier 120 (e.g., an amplifier). The input of the sample and hold circuit 112 is connected to the output of the first stage 101. The output of the sample and hold circuit 112 is connected to a positive input of the summation circuit 118 and the input of the sub-ADC 114. The output of the sub-ADC 114 is connected to the digital-to-analog converter 116. The output of the digital-to-analog converter 116 is connected to a negative input of the summation circuit 118. The output of the summation circuit 118 is connected to the multiplier 120.

When the START signal is high, the input voltage $V_{IN}$ to be converted is connected to the input of the first stage 101; otherwise, the input of the first stage 101 is connected to the output of the second stage 111 (via switch 103). The sample and hold circuit 102 of the first stage 101 samples $V_{IN}$ when a first clock signal $\Phi_1$ is high and holds the same when $\Phi_1$ is low. The sub-ADC 104 carries out a conversion of the input voltage $V_{IN}$. The N-bit output $D_1$ of the sub-ADC 104 is converted back to an analog voltage by the digital-to-analog converter 106 and then subtracted from the original input signal $V_{IN}$ by the summation circuit 108. The resulting error residue is then multiplied by $2^{N-1}$ in the multiplier 110 and fed as an analog input signal to the second stage 111. The second stage 111 operates in the same manner as the first stage 101, except that the sample and hold operation in the second stage 111 is controlled by a second clock signal $\Phi_2$ (in the same manner that the sample and hold operation in the first stage 101 is controlled by the first clock signal $\Phi_1$); the sub-ADC 114 of the second stage 111 has an N-bit output $D_2$.

Since the sub-ADCs 104, 114 resolve the input with an accuracy of $2^{-N}$, a multiplication factor of $2^N$ would let the error residue occupy the entire range of the sub-ADCs 104, 114 of the following stage. However, that would also require offset performance for the sub-ADCs 104, 114 in par with the resolution of the entire cyclic analog-to-digital converter 100. Otherwise, an offset in the sub-ADCs 104, 114 or the digital-to-analog converters 106, 116 would result in a faulty digital code and the error residue would exceed the range of the sub-ADCs 104, 114 of the following stage. Such an error cannot be recovered from and would result in missing codes. The most common solution to this problem is to introduce digital redundancy in the analog-to-digital converter 100.

There is one bit digital redundancy in the cyclic analog-to-digital converter 100 illustrated in FIG. 2 since the multiplication factor is $2^{N-1}$. This means that the error residue only occupies half the input range of the sub-ADCs 104, 114 of the following stage, and that only N−1 bits are effectively resolved per stage. A very common implementation is the 1.5 bits stage where the input range to the sub-ADCs 104, 114 is divided into three regions (1.5 bits). The multiplication factor is 2 and there are 2 digital output bits per stage (effectively 1.5 bits). With such an implementation, an offset in the bit transition points for the sub-ADCs 104, 114 of ±⅛ of the input range can be tolerated without resulting in missing codes.

The digital-to-analog converters 106, 116, error residue generation, and multiplication by 2 operation described above are often implemented with a switched capacitor circuit referred to as a multiplying digital-to-analog converter (MDAC). Switches are not shown for convenience purposes. Example configurations of two phases of an MDAC are illustrated in FIG. 3a. In FIG. 3a, the phase 1 MDAC configuration is labeled 220 and comprises two capacitors 222, 224 and an amplifier 226. The capacitors 222, 224 are connected to $V_{IN}$ in and are also connected to a negative input and the output of the amplifier 226. In FIG. 3a, the phase 2 MDAC configuration is labeled 230 and comprises capacitors 222, 224 and amplifier 226 connected to a digital-to-analog converter 106 instead of $V_{IN}$. A digital code $D_{IN}$ is input into the digital-to-analog converter 106, which outputs $V_{DAC}$ to capacitor 224, which is connected to capacitor 222. The connection between the capacitors 222, 224 is connected to a negative input of amplifier 226, which outputs $V_O$ to capacitor 222. Capacitor 222 has a capacitance $C_1$ while capacitor 224 has a capacitance $C_2$. The transition from phase 1 to phase 2 yields an output $V_O$ equal to $(1+C_2/C_1)V_{IN}-(C_2/C_1)V_{DAC}$.

The 1.5 bits cyclic ADC stage (described above) should have a transfer function according to FIG. 3b. In FIG. 3b, $V_O$ is the output from the first stage 101 in phase n and $V_{IN}$ is the output from the second stage 111 in phase n−1. It should be appreciated that $V_{IN}$ could be the output from the first stage 101 in phase n and $V_O$ could be the output from the second stage 111 in phase n−1. The transfer function illustrated in FIG. 3b can be written as:

$$v_o = \begin{cases} 2\left[v_{IN} - \frac{V_{REF}}{2}\right], & v_{IN} > \frac{V_{REF}}{4} \\ 2v_{IN}, & -\frac{V_{REF}}{4} \leq v_{IN} \leq \frac{V_{REF}}{4} \\ 2\left[v_{IN} + \frac{V_{REF}}{2}\right], & v_{IN} < -\frac{V_{REF}}{4} \end{cases} =$$

-continued $$\begin{cases} 2v_{IN} - V_{REF}, & v_{IN} > \frac{V_{REF}}{4} \\ 2v_{IN}, & -\frac{V_{REF}}{4} \leq v_{IN} \leq \frac{V_{REF}}{4} \\ 2v_{IN} - V_{REF}, & v_{IN} < -\frac{V_{REF}}{4} \end{cases}$$

From this transfer function it is clear that the multiplying digital-to-analog converter illustrated in FIG. 3a can be used in the cyclic analog-to-digital converter 100 if $C_1=C_2$ and the value of $V_{DAC}$ is one of $-V_{REF}$, 0, or $V_{REF}$. Cyclic analog-to-digital conversion would then be carried out according to FIG. 4, which illustrates example phases of a cyclic analog-to-digital converter 200 in operation. FIG. 4 is split into 3 sections, a first section representing phase 0 of a conversion cycle of the analog-to-digital converter 200, a second section representing odd phases 1, 3, 5, . . . of the conversion cycle and a third section representing additional even phases 2, 4, 6, . . . of the conversion cycle of the analog-to-digital converter 200.

In phase 0, the first stage 201 of cyclic analog-to-digital converter 200 is configured with MDAC 220, sub-ADC 104 and digital-to-analog converter 106; the second stage 211 of cyclic analog-to-digital converter 200 comprises capacitors 232, 234 and an amplifier 236 connected in the MDAC 230 configuration, sub-ADC 114 and digital-to-analog converter 116. The output from the sub-ADC 104 of the first stage 201 is $D_0$ while the output of the sub-ADC 114 of the second stage 201 is $D_N$. The cyclic analog-to-digital converter 200 then transitions from phase 0 to phase 1 (as shown by arrow A).

In phase 1, the first stage 201 of cyclic analog-to-digital converter 200 is configured with MDAC 220', which includes capacitors 222, 224 connected between the output of the digital-to-analog converter 106 and the input of the second stage 211. As can be seen, the capacitors 222, 224 are arranged in the phase 2 MDAC configuration. The second stage 211 is configured with MDAC 230', which includes capacitors 232, 234 connected in the MDAC phase 1 configuration. The output from the sub-ADC 104 of the first stage 201 is $D_0$ while the output of the sub-ADC 114 of the second stage 201 is $D_1$. The cyclic analog-to-digital converter 200 then transitions from phase 1 to phase 2 (as shown by arrow B).

In phase 2, the first stage 201 of cyclic analog-to-digital converter 200 is configured with MDAC 220, sub-ADC 104 and digital-to-analog converter 106; the second stage 211 of cyclic analog-to-digital converter 200 is configured with MDAC 230, sub-ADC 114 and digital-to-analog converter 116. The output from the sub-ADC 104 of the first stage 201 is $D_2$ while the output of the sub-ADC 114 of the second stage 201 is $D_1$. The cyclic analog-to-digital converter 200 then cycles through phases 3, 4, 5, 6, . . . (as shown by arrows C and B) until the last bit of the analog-to-digital converter's 200 resolution has been output.

Although the aforementioned cyclic analog-to-digital converter 200 works well, it is not without its shortcomings. For example, it is desirable to reduce power consumption and improve settling times and noise power in cyclic analog-to-digital converters, particularly those used in imagers.

BRIEF DESCRIPTION OF THE DRAWINGS

FIG. 6, comprising FIGS. 6A and 6B, illustrates example phases of the cyclic analog-to-digital converter illustrated in FIG. 5 in operation. FIG. 6A shows phases 0 and 1, while 6B shows phases 2 and 3.

FIG. 7, comprising

DETAILED DESCRIPTION

Figure 5:
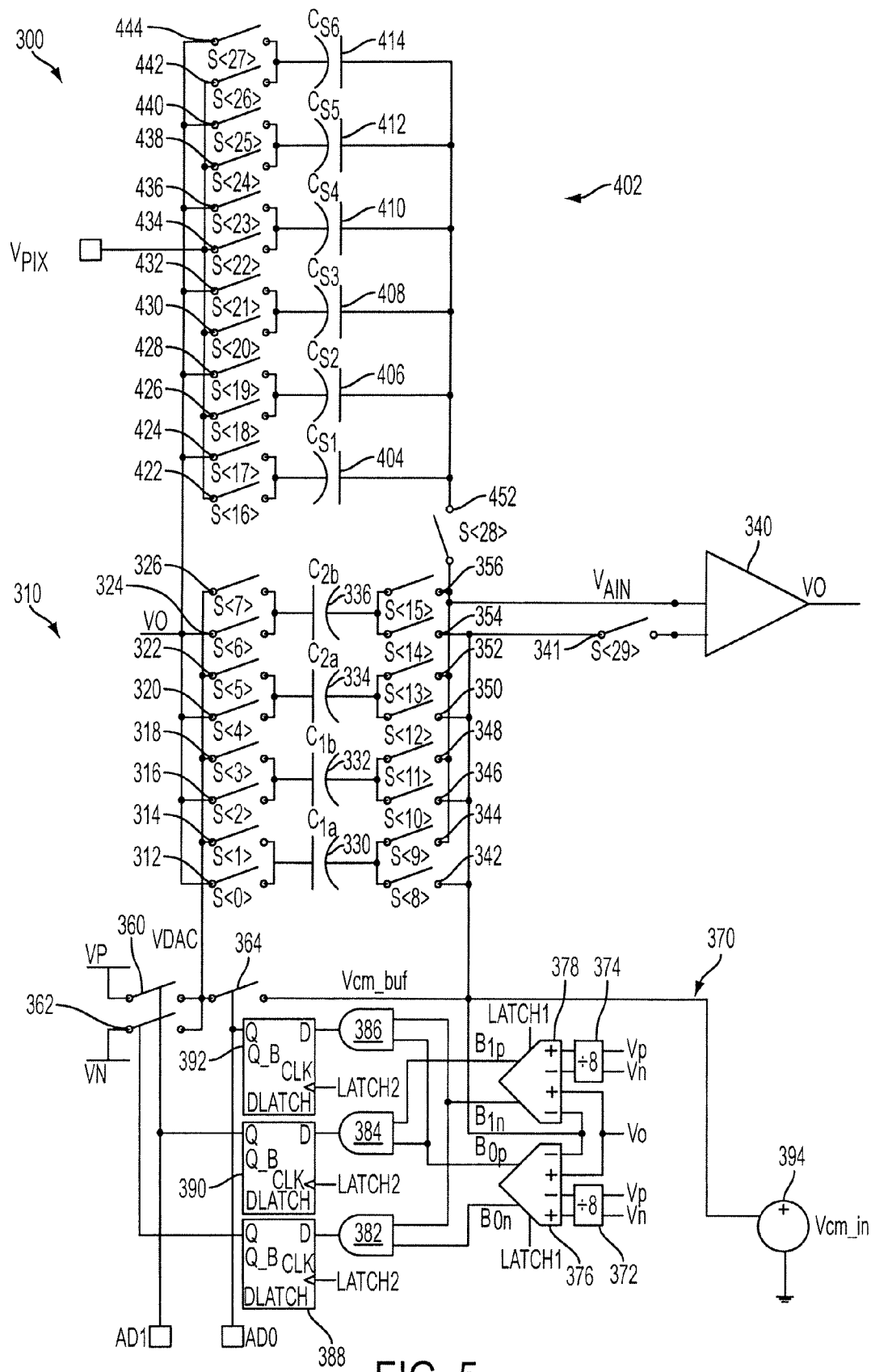
FIG. 5 is a schematic diagram of a cyclic analog-to-digital converter constructed in accordance with an embodiment disclosed herein.

Referring to the figures, where like reference numbers designate like elements, FIG. 5 illustrates a schematic diagram of a cyclic analog-to-digital converter 300 used in a column parallel readout imager architecture in accordance with an embodiment disclosed herein. The illustrated converter 300 includes input circuitry 402, MDAC 310 circuitry and a sub-ADC/DAC 370. As can be seen from FIG. 5, the cyclic analog-to-digital converter 300 contains only one stage whereas the conventional cyclic analog-to-digital converters 100, 200 discussed above contain two stages. The use of one stage in the illustrated cyclic analog-to-digital converter 300 reduces power consumption and size (i.e., layout) of the converter 300 in comparison to conventional cyclic analog-to-digital converters.

Figure 1:
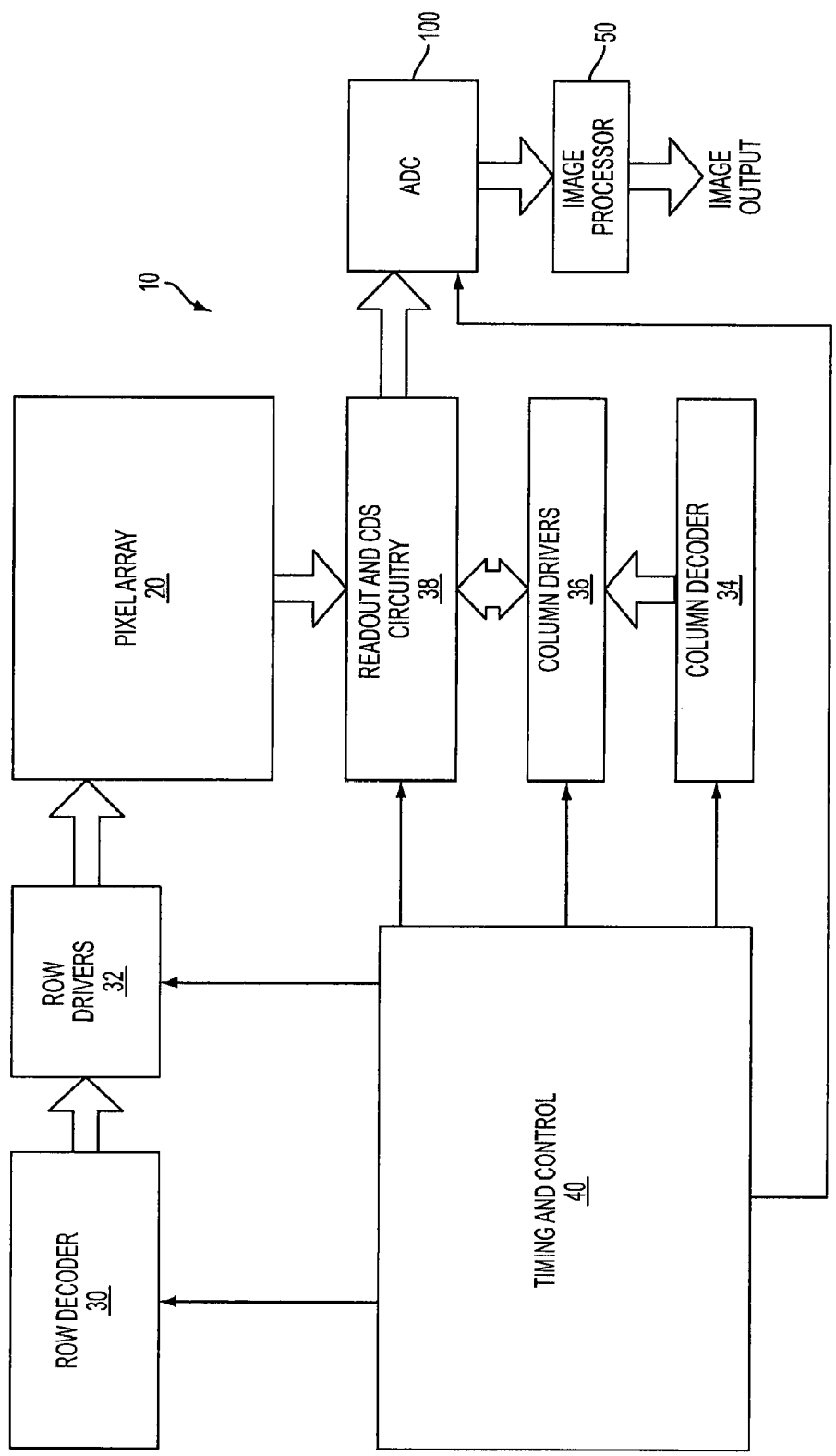
FIG. 1 illustrates a block diagram of a CMOS imager.
Figure 2:
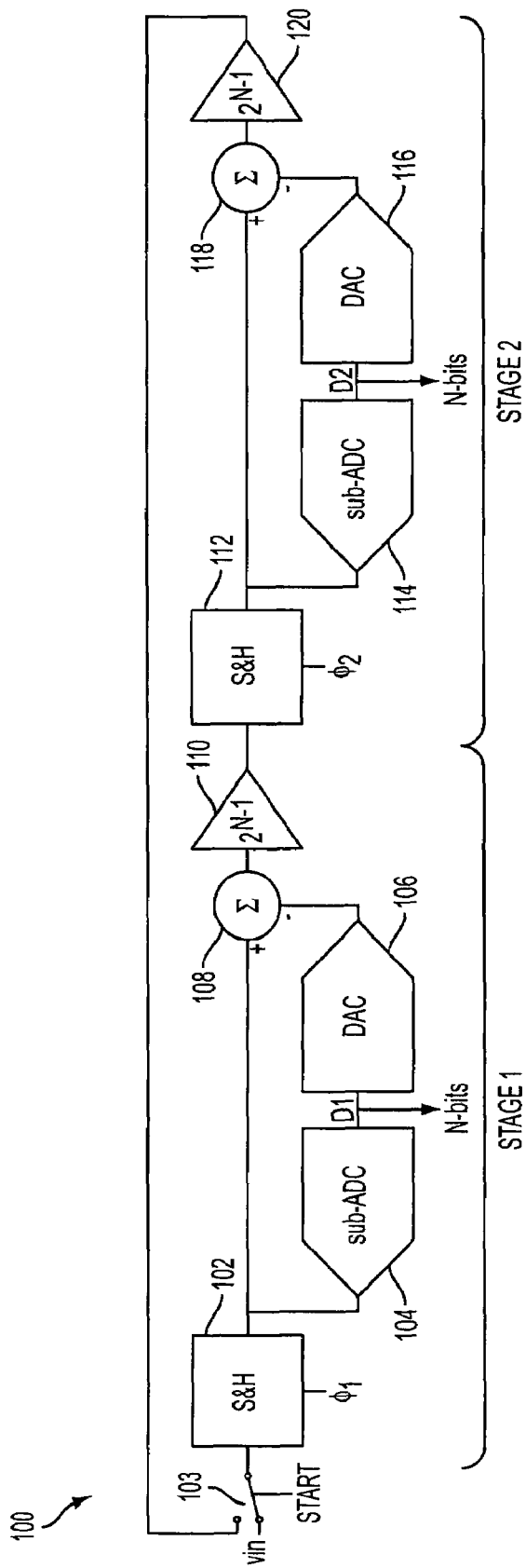
FIG. 2 illustrates an example conceptual diagram of a cyclic analog-to-digital converter.
Figure 3A:
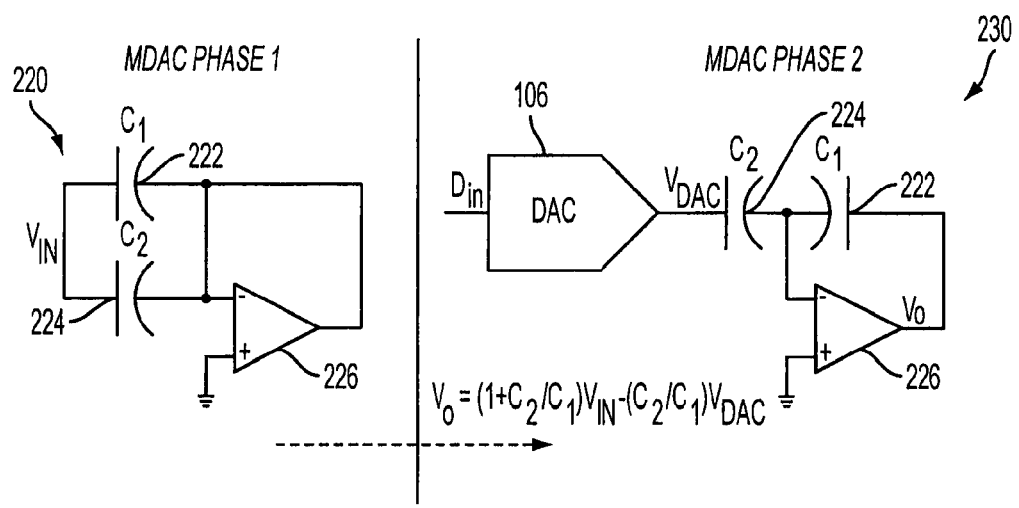
FIG. 3a illustrates an example of a multiplying digital-to-analog converter (MDAC).
Figure 3B:
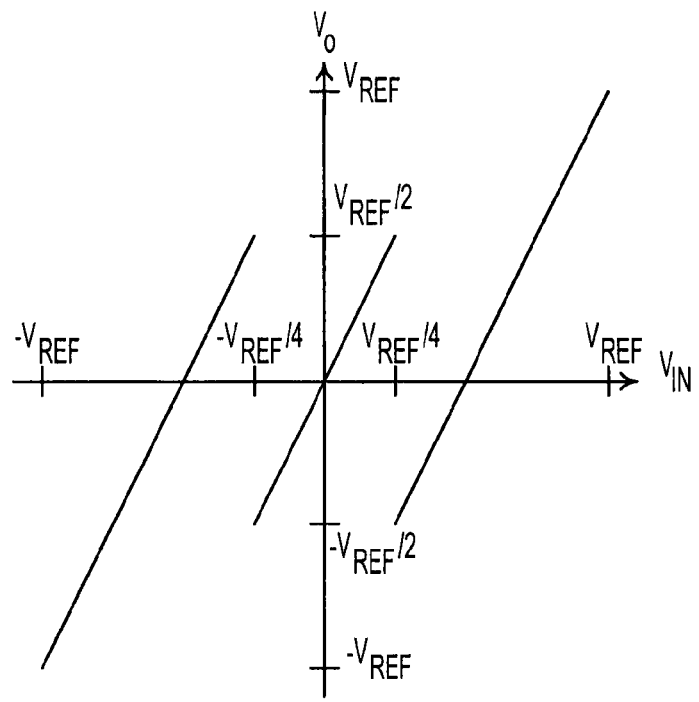
FIG. 3b illustrates an example transfer function for the FIG. 2 cyclic analog-to-digital converter.

The input circuitry 402 comprises thirteen switches 422, 424, 426, 428, 430, 432, 434, 436, 438, 440, 442, 444, 452 and six capacitors 404, 406, 408, 410, 412, 414. Switches 422, 426, 430, 434, 438, and 442 are respectively connected between the capacitors 404, 406, 408, 410, 412, 414 and a pixel output line receiving analog pixel signal $V_{PIX}$ from the readout and correlated double sampling circuitry 38 (FIG. 1). Switches 424, 428, 432, 436, 440, and 444 are respectively connected between the capacitors 404, 406, 408, 410, 412, 414 and the output $V_O$ from an amplifier 340 of the MDAC circuitry 310. The input signal $V_{PIX}$ is stored at the capacitors 404, 406, 408, 410, 412, 414, having capacitances $C_{S1}$, $C_{S2}$, $C_{S3}$, $C_{S4}$, $C_{S5}$, $C_{S6}$, respectively, when control signals s<16>, s<18>, s<20>, s<22>, s<24> and s<26> close switches 422, 426, 430, 434, 438, and 442. The output $V_O$ is stored at the capacitors 404, 406, 408, 410, 412, 414 when control signals s<17>, s<19>, s<21>, s<23>, s<25> and s<27> close switches 424, 428, 432, 436, 440, and 444. Switch 452 couples the second plates of capacitors 404, 406, 408, 410, 412, 414 to the MDAC 310 when closed by control signal s<28>. Capacitors 404, 406, 408, 410, 412, and 414 are used to implement a column gain amplifier. Although only two of these capacitors are typically required, a practical implementation should use more capacitors to provide the capability to program different gain settings, if desired. This is because the gain would be computed as the capacitance connected between the amplifier input and $V_{PIX}$ divided by the capacitance connected between the amplifier input and its output.

The MDAC 310 comprises twenty switches 312, 314, 316, 318, 320, 322, 324, 326, 341, 342, 344, 346, 348, 350, 352, 354, 356, 360, 362, 364, four capacitors 330, 332, 334, 336 and amplifier 340. Capacitor 330, having a capacitance $C_{1a}$, is connected between switches 312, 314 and switches 342, 344. Capacitor 332, having a capacitance $C_{1b}$, is connected between switches 316, 318 and switches 346, 348. Capacitor 334, having a capacitance $C_{2a}$, is connected between switches 320, 322 and switches 350, 352. Capacitor 336, having a capacitance $C_{2b}$, is connected between switches 324, 326 and switches 354, 356.

Switches 312, 316, 320 and 324 connect the capacitors 330, 332, 334, 336 to the output $V_O$ from the amplifier 340 when the switches 312, 316, 320, 324 are closed in response to control signals s<0>, s<2>, s<4> and s<6>, respectively. Switches 314, 318, 322 and 326 connect the capacitors 330, 332, 334, 336 to a digital-to-analog conversion voltage Vdac output from the sub-ADC/DAC 370 when the switches 314, 318, 322, 326 are closed in response to control signals s<1>, s<3>, s<5> and s<7>, respectively.

Switches 342, 346, 350, and 354 connect the capacitors 330, 332, 334, 336 to a buffered common mode voltage $V_{CM\_BUF}$ output from a common mode voltage buffer 394 when the switches 342, 346, 350, 354 are closed in response to control signals s<8>, s<10>, s<12> and s<14>, respectively. Switches 344, 348, 352, and 356 are also connected to the second plate of capacitors 404, 406, 408, 410, 412 and 414 (of the input circuit 402) when switch 452 (of the input circuit 402) is closed in response to signal s<28>. Thus, when switches 452, 344, 348, 352, and 356 are closed, in response to control signals s<28>, s<9>, s<11>, s<13> and s<15>, respectively, the MDAC 310 inputs the analog pixel signal $V_{PIX}$, which can be stored at capacitors 330, 332, 334, and 336. The amplifier 340 inputs the analog pixel signal $V_{PIX}$ as analog input voltage $V_{AIN}$. Switch 341, when closed in response to control signal s<29>, connects to the amplifier 340 to the buffered common mode voltage $V_{CM\_BUF}$.

Switch 360, activated by an output q from a latch 390 in the sub-ADC/DAC 370 connects a global positive reference voltage vp to a node where the MDAC 310 inputs the voltage vp as the Vdac voltage. Switch 362, activated by an output q from a latch 388 in the sub-ADC/DAC 370 connects a global negative reference voltage vn to the node where the MDAC 310 inputs the voltage vn as the Vdac voltage. Switch 364, activated by an output q from a latch 392 in the sub-ADC/DAC 370 connects the buffered common mode voltage $V_{CM\_BUF}$ to the node where the MDAC 310 inputs the voltage $V_{CM\_BUF}$ as the Vdac voltage.

The sub-ADC/DAC 370 comprises two "by-eight" dividers 372, 374, two differential comparators 376, 378, three AND gates 382, 384, 386 and the three latches 388, 390, 392. Comparator 378 inputs the global positive reference voltage vp (via divider 374) at a first positive input terminal. Comparator 376 inputs a global negative reference voltage vn (via divider 372) at a first positive input terminal. Comparator 376 inputs the global positive reference voltage vp (via divider 372) at a first negative input terminal. Comparator 378 inputs the global negative reference voltage vn (via divider 374) at a first negative input terminal. The comparators 376, 378 input the buffered common mode voltage $V_{CM\_BUF}$ at a second negative input terminal. The comparators 376, 378 input the output of the amplifier $V_O$ at a second positive input terminal. The comparators 376, 378 are controlled by control signal latch1. The first comparator 376 has a differential output consisting of bits $b_{0n}$, $b_{0p}$ and the second comparator 378 has a differential output consisting of bits $b_{1n}$, $b_{1p}$.

The first AND gate 382 inputs comparator output $b_{0n}$ from comparator 376 and comparator output $b_{1n}$ from comparator 378. The output of the first AND gate 382 is used as an input by latch 388. The second AND gate 384 inputs comparator output $b_{0p}$ from comparator 376 and comparator output $b_{1p}$ from comparator 378. The output of the second AND gate 384 is used as an input by latch 390. The third AND gate 386 inputs comparator output $b_{0p}$ from comparator 376 and comparator output $b_{1n}$ from comparator 378. The output of the third AND gate 386 is used as an input by latch 392. The latches 388, 390, 392 are clocked by control signal latch2. The q output of latch 390 corresponds to output bit ad1 of the sub-ADC/DAC 370 and the cyclic analog-to-digital converter 300. The q output of latch 392 corresponds to output bit ad0 of the sub-ADC/DAC 370 and the cyclic analog-to-digital converter 300. The two output bits ad0, ad1 comprise a digital output $D_i$ of the cyclic analog-to-digital converter 300 for the current phase i (described in more detail below).

An imager incorporating one or more cyclic analog-to-digital converters 300 discussed above can be operated using correlated double sampling (CDS) readout to obtain low pixel fixed pattern noise (FPN) and low pixel contributed temporal noise (i.e., no kTC noise from the pixel reset operation). As briefly discussed above, this is performed by reading out the pixel reset level $V_{rst}$ followed by the pixel signal level $V_{sig}$. $V_{rst}$–$V_{sig}$ is proportional to the incident light striking the pixel. Correlated double sampling can be carried out in the analog domain (before analog-to-digital conversion as discussed above with respect to FIG. 1) or in the digital domain (after analog-to-digital conversion). The analog correlated double sampling requires one analog-to-digital conversion (i.e., the conversion of $V_{rst}$–$V_{sig}$) while the digital correlated double sampling requires two conversions (one for $V_{rst}$ and one for $V_{sig}$). The architecture illustrated in the FIG. 5 example is best suited for digital correlated double sampling (discussed in more detail below), but it should be appreciated that analog correlated double sampling can also be carried out (discussed below in more detail).

Generally, the digital correlated double sampling operation is performed by: (1) resetting the column amplifier using a black voltage level $V_{blk}$; (2) applying gain to $V_{rst}$ and sampling the signal on the analog-to-digital capacitors; (3) performing an analog-to-digital conversion of $V_{rst}$ (phases 1 to N); (4) applying gain to $V_{sig}$ and sampling the signal on the analog-to-digital capacitors; and (5) performing an analog-to-digital conversion of $V_{sig}$ (phases 1 to N). Generally, the analog correlated double sampling operation is performed by: (1) setting Vdac equal to vn to perform unipolar-to-bipolar conversion (and deducting vref from the output); (2) sampling $V_{rst}$; (3) generating $V_{rst}$–$V_{sig}$; and (4) performing an analog-to-digital conversion of $V_{rst}$–$V_{sig}$ (phases 1 to N). Each technique offers its own advantages, which are not discussed herein.

Figure 6B:
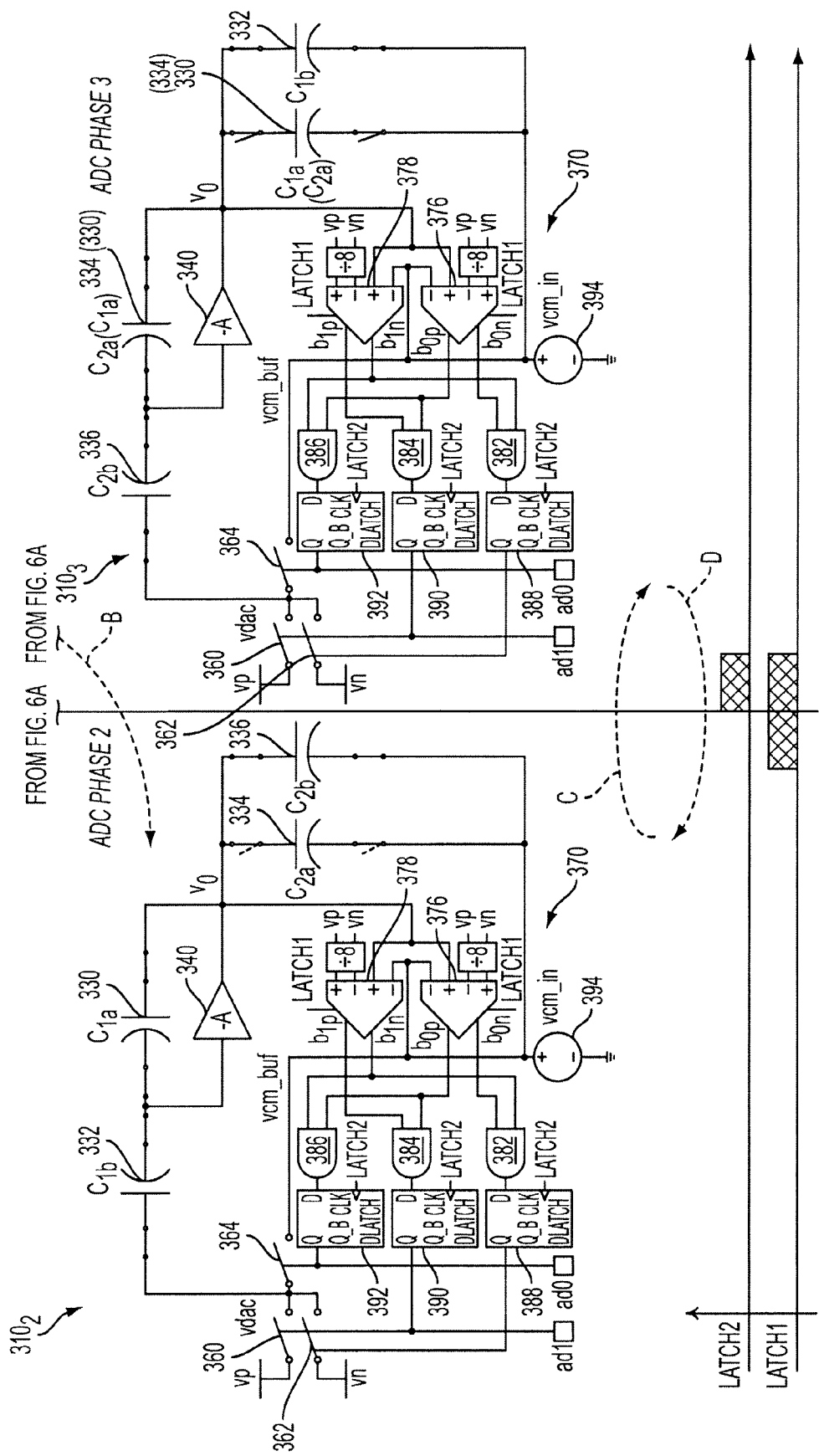

FIG. 6 illustrates example phases of the cyclic analog-to-digital converter 300 (FIG. 5) in operation. It should be appreciated that there will be N phases, because the analog-to-digital converter 300 has an N-bit resolution. It should be appreciated that N-1 phases could be used if a missing start code (or end code) were used (e.g., 0 or $2^{(N-1)}$). In FIG. 6, the configuration of the MDAC capacitors 330, 332, 334, 336 are different in each phase. Accordingly, the MDAC circuitry is labeled $310_0$ in phase 0, $310_1$ in phase 1, $310_2$ in phase 2 and $310_3$ in phase 3. The MDAC configurations $310_0$, $310_1$, $310_2$, $310_3$, are created by closing and opening the switches 312, 314, 316, 318, 320, 322, 324, 326, 341, 342, 344, 346, 348, 350, 352, 354, 356, 360, 362, 364 (illustrated in FIG. 5) in the manner described below. The configuration of the sub-ADC/DAC 370, however, is the same as the configuration illustrated in FIG. 5. FIG. 6 also illustrates an example timing of the latch1 and latch2 control signals in each phase.

In phase 1 to N the output of the amplifier is given by:

$$v_{On} = 2v_{On-1} - \begin{cases} vp, & D_{n-1} = 10 \\ vcm, & D_{n-1} = 01 \\ vn, & D_{n-1} = 00 \end{cases} \Leftrightarrow v_{On} - vcm =$$

$$\begin{cases} 2\left[(v_{On-1} - vcm) - \frac{(vp-vn)}{4}\right], & D_{n-1} = 10 \\ 2(v_{On-1} - vcm), & D_{n-1} = 01 \\ 2\left[(v_{On-1} - vcm) + \frac{(vp-vn)}{4}\right], & D_{n-1} = 00 \end{cases}$$

The equivalence between the above expressions is based on vcm being equal to (vp+vn)/2. As described above, $D_i$ is the two-bit notation of the digital output in phase i, $D_i$=(ad1$_i$, ad0$_i$).

Initially, the operation will be described for the analog correlated double sampling procedure outlined above. Referring to FIGS. 5 and 6, prior to phase 0, there is a reset operation where the analog input signal $V_{PIX}$ is Vrst and is sampled in the input circuitry 402 capacitors 404, 406, 408, 410, 412 and 414 by closing switches 422, 426, 430, 434, 438, 442, 344, 348, 352, 356, 452 and 341 (by generating signals s<16>, s<18>, s<20>, s<22>, s<24>, s<26>, s<9>, s<11>, s<13>, s<15>, s<28> and s<29>). Switch 362 is also closed. At this time, the first plate of capacitors 330, 332, 334, 336 of the MDAC 310 are connected to Vdac by closing switches 314, 318, 322 and 326 (by generating signals s<1>, s<3>, s<5>, and s<7>). Switch 341 can then be opened.

The first analog correlated double sampling phase begins when the sampled $V_{PIX}$ signal is sampled on capacitors 330, 332, 334, 336 of the MDAC $310_0$ by opening switches 314, 318, 322 and 326. When $V_{PIX}$ is $V_{sig}$, the second analog correlated double sampling operation occurs by closing switches 312, 316, 320, 324 and 452 (by generating signals s<0>, s<2>, s<4>, s<6> and s<28>). Also, switches 344, 348, 352 and 356 are closed (by generating signals s<9>, s<11>, s<13>, and s<15>) to connect the second plate of capacitors 330, 332, 334 and 336 to the input of the amplifier 340 and the second plate of capacitors 404, 406, 408, 410, 412, 414. Phase 0 of the analog-to-digital conversion begins by opening switch 452. As described above, the common mode level for the amplifier 340 is Vcm (via $V_{CM\_BUF}$ connected through switch 341 when signal s<29> is activated) so the input signal sampled at the amplifier 340 is $V_O$–Vcm. The sub-ADC/DAC 370 converts this signal to digital form at the transition between phase 0 and phase 1. This is done by applying a high latch1 control signal, which will cause the comparators 376, 378 to make a decision and change their respective outputs $b_{0n}$, $b_{0p}$, $b_{1n}$, $b_{1p}$ based on a comparison of their respective inputs (i.e., positive voltage vp, negative reference voltage vn, buffered common mode voltage $V_{CM\_BUF}$, and the output of the amplifier 340). It should be noted that capacitors 330, 332, 334, 336 could be disconnected from the amplifier 340 before activating the latch2 control signal. It should be appreciated that this disconnect operation is not necessary for phase 0 and is optional since the amplifier 340 output is not affected by changes in Vdac; however, for all the other phases the disconnect operation is required.

The control signals latch1 and latch2 need to overlap in the illustrated embodiment since the comparators 376, 378 are fully differential and produce differential output values $-V_{AA}$, 0, or $V_{AA}$, where $V_{AA}$ is the power supply voltage (not shown) for the comparators 376, 378. When the latch1 control signal is low, the comparators 376, 378 output a 0; however, when the latch1 control signal is high, the comparators 376, 378 make a decision based on their respective inputs and output either $-V_{AA}$ or $V_{AA}$, depending on the value of the input signal. In order to capture the comparator decisions, and not the 0 output, the latch1 and latch2 control signals need to overlap as shown in FIG. 6 at the transition between phase 0 and phase 1. Once the latch2 control signal is generated, the outputs ad1, ad0 (i.e., $D_0$ for phase 0) connected to latches 390 and 392 are set as described above.

The cyclic analog-to-digital converter 300 transitions to phase 1 (shown by arrow A). During phase 1, the MDAC $310_1$ generates the error residue by folding half the capacitance ($C_{2a}$ and $C_{2b}$) that had the output signal of phase 0 sampled across them (e.g., capacitors 330, 332, 334, 336) to Vdac. The folding of the capacitance occurs by opening switches 320, 324 (by removing signals s<4> and s<6>) and closing switches 322, 326 (by generating signals s<5> and s<7>). This is a precision multiply-by-2 operation with a simultaneous subtraction of the Vdac value. As described above for phase 0, the Vdac value was determined and latched when the analog-to-digital converter 300 made the transition from phase 0 to phase 1. The error residue can be written as $v_{O1}=2v_{O0}-vdac_0$. The sub-ADC/DAC 370 makes a conversion of this value $v_{O1}$, which is latched in the transition between phases 1 and 2, in the same way that the amplifier 340 output was latched in phase 0. The outputs ad1, ad0 (i.e., $D_0$ for phase 0) connected to latches 390 and 392 are set as described above.

The cyclic analog-to-digital converter 300 transitions to phase 2 (shown by arrow B). During phase 2, the MDAC $310_2$ generates the error residue by folding half the capacitance $C_{1b}$ (i.e., capacitor 332) that had the output signal of phase 1 sampled across them (i.e., capacitors 330 and 332) to Vdac. The folding of the capacitance occurs by opening switches 316, 322, and 326 (by removing signals s<2>, s<5> and s<7>) and closing switches 318, 320 and 324 (by generating signals s<3>, s<4> and s<6>). This is a precision multiply-by-2 operation with a simultaneous subtraction of the Vdac value. The Vdac value was determined and latched when the circuit made the transition from phase 1 to 2. The error residue can be written as $v_{O2}=2v_{O1}-vdac_1$. The sub-ADC/DAC 370 makes a conversion of this value $v_{O2}$, which is latched in the transition between phases 2 and 3, in the same way that the amplifier 340 output was latched in phase 0. The outputs ad1, ad0 (i.e., $D_0$ for phase 0) connected to latches 390 and 392 are set as described above.

It should be noted that the error residue of phase 2 is also sampled across the capacitors 330, 334 and 336 in this transition. In one embodiment, it is desirable to reduce the number of capacitors used in phase 2 to three capacitors. In this alternative embodiment, the switches 320, 322, 350, 352 for capacitor 334 (shown as dashed lines) are left open meaning that the amplifier output is only sampled on capacitors 330 and 336.

The cyclic analog-to-digital converter 300 transitions to phase 3 (shown by arrow C). During phase 3, the MDAC $310_3$ generates the error residue by folding half the capacitance $C_{2b}$ (i.e., capacitor 336) that had the output signal of phase 2 sampled across them (i.e., capacitors 334 and 336) to Vdac. As mentioned above, this is a precision multiply-by-2 operation with a simultaneous subtraction of the Vdac value. The folding of the capacitance occurs by opening switches 318, 324, 344, 348, 350, and 354 (by removing signals s<3>, s<6>, s<9>, s<11>, s<12> and s<14>) and closing switches 316, 326, 342, 346, 352 and 356 (by generating signals s<2>, s<7>, s<8>, s<10>, s<13> and s<15>). The Vdac value was determined and latched when the circuit made the transition from phase 2 to 3. The error residue can be written as $v_{O3}=2v_{O2}-vdac_2$. The sub-ADC makes a conversion of this value $v_{O3}$, which is latched in the transition between phases 3 and 4, in the same way that the amplifier 340 output was latched in phase 0. The outputs ad1, ad0 (i.e., $D_0$ for phase 0) connected to latches 390 and 392 are set as described above. The error residue of phase 3 is sampled across capacitors 330, 332 and 334. In the alternative embodiment discussed above whereby only three capacitors are used in phase 2, the switches 320, 322, 350, 352 for capacitor 334 (shown as dashed lines) are left open while capacitor 330 remains connected as feedback for the amplifier 340. In the alternative embodiment, the output signal is only sampled on capacitors 330 and 332.

The cyclic analog-to-digital converter 300 transitions back to phase 2 (shown by arrow D) and continues to jump between phase 2 and phase 3 for the rest of the conversion. As described above, one set of capacitors is used to calculate the error residue and the other set (or one in the three capacitor embodiment) is used to sample the same. The conversion is finished after cycle N, when N effective bits have been calculated. In the three capacitor alternative embodiment discussed above, capacitors 332 and 336 swaps places, when going back and forth between phases 2 and 3.

As described above, digital correlated double sampling is performed by: (1) resetting the column amplifier using a black voltage level $V_{blk}$; (2) applying gain to $V_{rst}$ and sampling the signal on the analog-to-digital capacitors; (3) performing an analog-to-digital conversion of $V_{rst}$ (phases 1 to N); (4) applying gain to $V_{sig}$ and sampling the signal on the analog-to-digital capacitors; and (5) performing an analog-to-digital conversion of $V_{sig}$ (phases 1 to N). For the digital correlated double sampling procedure, there is a conversion of $V_{rst}$ and then a conversion of $V_{sig}$. Therefore, $V_{PIX}$ is $V_{rst}$ for the first conversion and $V_{sig}$ for the second conversion. Analog-to-digital conversion phases 1-N for $V_{rst}$ and $V_{sig}$, however, are performed as described above with reference to FIGS. 5 and 6.

The gain applying steps, however, are slightly different than the initial phase 0 procedure outlined above. That is, referring again to FIGS. 5 and 6, the analog input signal $V_{PIX}$ (i.e., either $V_{rst}$ or $V_{sig}$) is sampled in the input circuitry 402 capacitors 404, 406, and 408 by closing switches 422, 426, and 430 (by generating signals s<16>, s<18>, and s<20>) while capacitors 410, 412, and 414 are connected to the amplifier output $V_O$ by closing switches 436, 440, 444 (by generating s<23>, s<25> and s<27>). The gained-up $V_{PIX}$ signal is sampled on capacitors 330, 332, 334, 336 of the MDAC $310_0$ by closing switches 312, 316, 318, 320 and 452 (by generating signals s<0>, s<2>, s<4>, s<6> and s<28>) while switches 342, 346, 350 and 354 are closed (by generating signals s<8>, s<10>, s<12>, and s<14>) to connect the second plate of capacitors 330, 332, 334 and 336 to $V_{CM\_BUF}$. The sub-ADC/DAC 370 converts this signal to digital form when the latch1 and latch2 signals are generated as described above.

Figure 4:
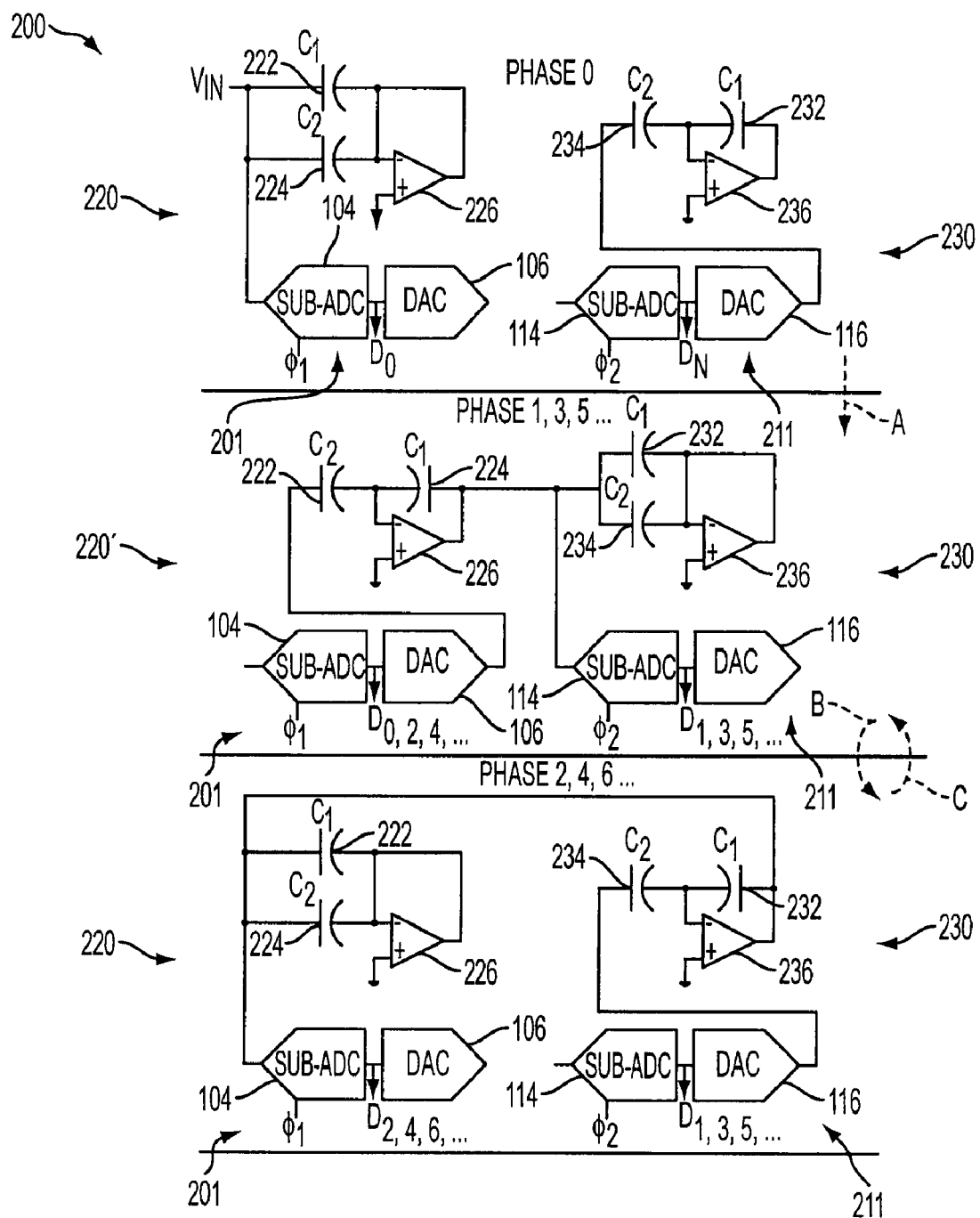
FIG. 4 illustrates example phases of a cyclic analog-to-digital converter in operation.

The benefits of the above embodiments are now discussed. The inventors have modeled the analog-to-digital converters 200, 300 described above and the three capacitor alternative embodiment to determine noise power and settling times for the different phases of their operation. In Table I below, "ADC1" refers to the conventional analog-to-digital converter 200 illustrated in FIG. 4, "ADC2" is the analog-to-digital converter 300 illustrated in FIG. 6 when all four capacitors 330, 332, 334, 336 are used in phase 2 and beyond, and "ADC3" is the proposed modification of the alternative embodiment, where only three capacitors are used in phase 2 and beyond. As can be seen, the results for the analog-to-digital converter 300 and its modified embodiment are much better than the results of the conventional analog-to-digital converter 200.

to more optimal values (indicated in Table I above) with high accuracy. Accordingly, running the conversion with an optimal duration for each phase minimizes the power consumption for a given noise and conversion time specification. This is another desirable result of the cyclic analog-to-digital converters 300 disclosed herein.

The fundamental performance limit for a cyclic ADC is capacitor mismatch. This can be improved by selecting the capacitors in a (pseudo) random fashion, which will convert the resulting structural noise into temporal noise. In many cases this is preferred. Selecting capacitors in a random fashion improves integral nonlinearity (INL) and differential nonlinearity (DNL) at the expense of increased temporal noise.

TABLE I

Noise Power and Settling Error Comparisons

| Phase | Noise Power | | | Settling time | | |
|---|---|---|---|---|---|---|
| | ADC 1 | ADC 2 | ADC 3 | ADC 1 | ADC 2 | ADC 3 |
| 0 | $\frac{kT}{2C}$ | $\frac{kT}{4C}$ | $\frac{kT}{4C}$ | $\frac{2C}{G_m}(N+2)\ln 2$ | $\frac{4C}{G_m}(N+2)\ln 2$ | $\frac{4C}{G_m}(N+2)\ln 2$ |
| 1 | $\frac{kT}{5C}$ | $\frac{kT}{2C}$ | $\frac{kT}{2C}$ | $\frac{5C}{G_m}(N+1)\ln 2$ | $\frac{2C}{G_m}(N+1)\ln 2$ | $\frac{2C}{G_m}(N+1)\ln 2$ |
| 2 | $\frac{kT}{20C}$ | $\frac{kT}{20C}$ | $\frac{kT}{12C}$ | $\frac{5C}{G_m}N \ln 2$ | $\frac{5C}{G_m}N \ln 2$ | $\frac{3C}{G_m}N \ln 2$ |
| 3 | $\frac{kT}{80C}$ | $\frac{kT}{80C}$ | $\frac{kT}{48C}$ | $\frac{5C}{G_m}(N-1)\ln 2$ | $\frac{5C}{G_m}(N-1)\ln 2$ | $\frac{2C}{G_m}(N+1)\ln 2$ |
| N-1 | $\frac{kT}{5C}2^{-2(N-2)}$ | $\frac{kT}{5C}2^{-2(N-2)}$ | $\frac{kT}{3C}2^{-2(N-2)}$ | $\frac{5C}{G_m}3 \ln 2$ | $\frac{5C}{G_m}3 \ln 2$ | $\frac{3C}{G_m}3 \ln 2$ |

As described above, the analog-to-digital converter 300 of FIG. 5 uses only one stage whereas the conventional analog-to-digital converter 200 required two stages. It is not necessary to use two stages. Using only one stage minimizes power consumption and size (i.e., layout) of the cyclic ADC.

Since the error residue is amplified by 2 in each phase, the input referred noise power is divided by 4 and the total noise of the analog-to-digital converter 300 will be dominated by the noise sampled in phase 0. This is especially true when all noise sources are considered and correlated double sampling are taken into account. To minimize noise, all of the capacitors 330, 332, 334, 336, 404, 406, 408, 410, 412, and 414 are used to sample the input signal $V_{PIX}$ in phase 0. Using the maximum available capacitance in the first phase minimizes temporal noise in comparison to conventional analog-to-digital converters.

In addition, it should be appreciated that the scale down of capacitive load in phase 1 of the analog-to-digital converter 300 and the use of three capacitors in phase 2 and beyond in an embodiment of the analog-to-digital converter 300 helps reduce settling time, while having little impact on the converter's noise performance. Thus, it should be appreciated that for a given noise and conversion time specification, the scale down results in lower power consumption in comparison to conventional cyclic analog-to-digital converters.

Figure 7A:
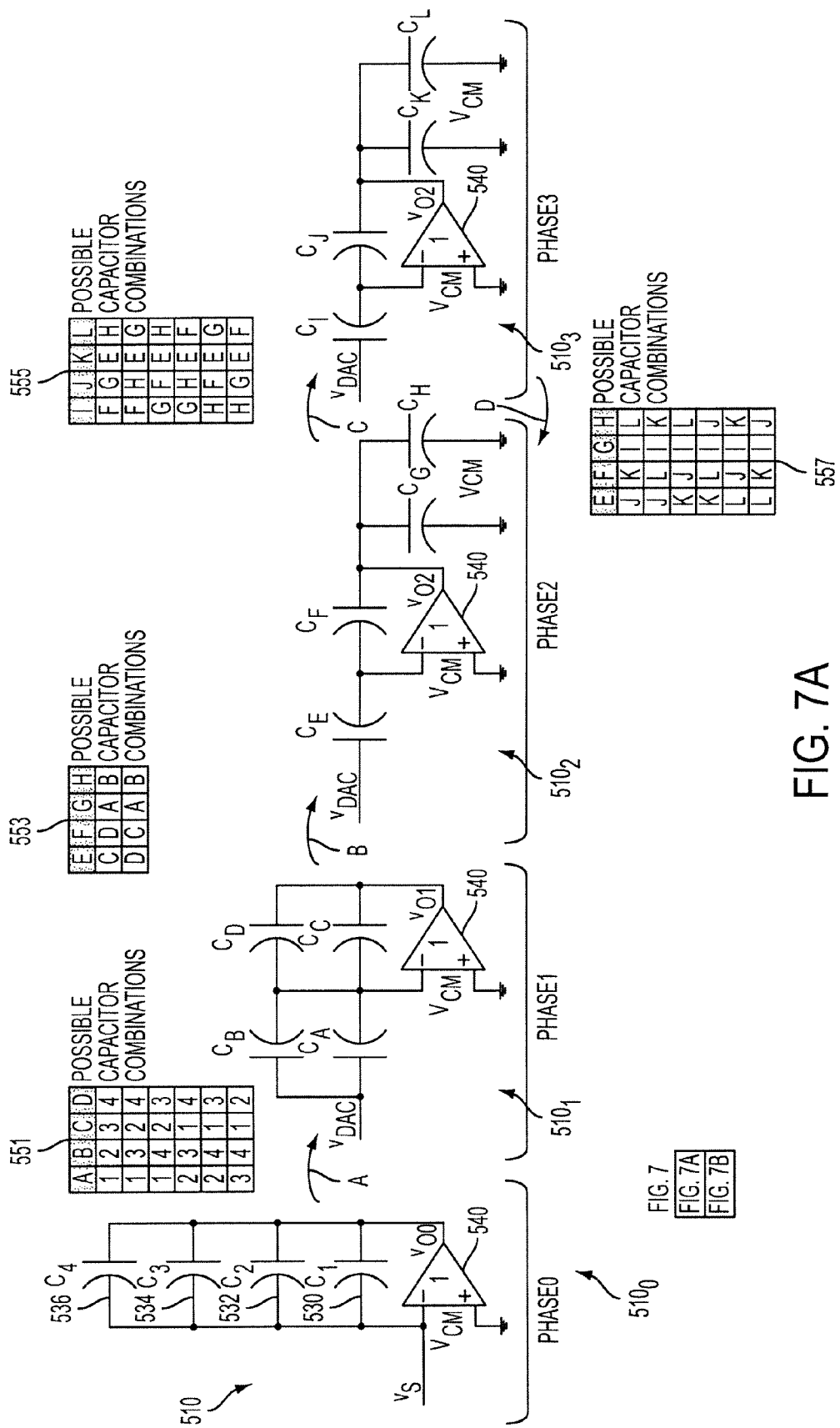
FIGS. 7A and 7B illustrates example implementations of random capacitor selection performed in accordance with embodiments disclosed herein.
Figure 7B:
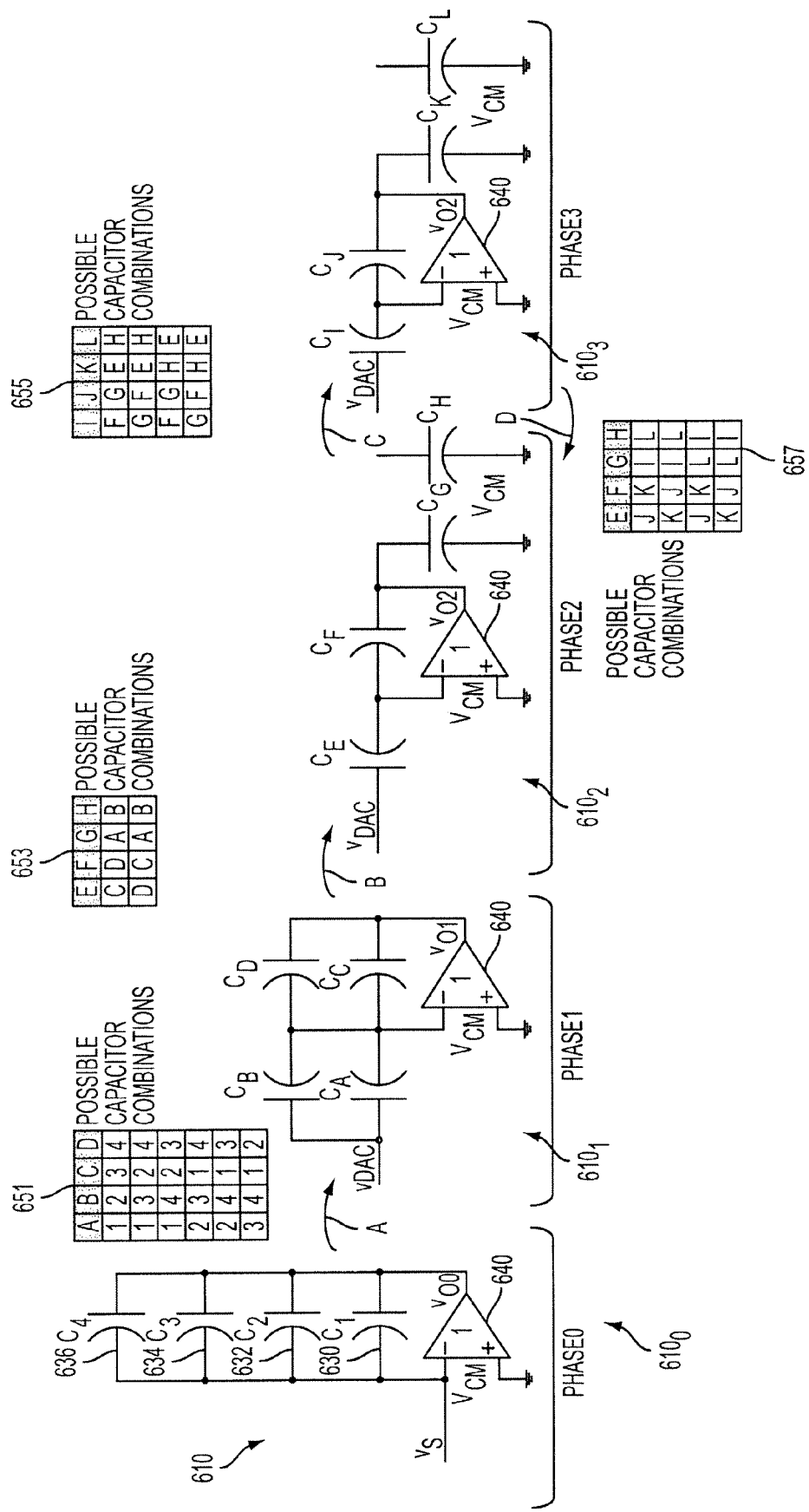

For an imager, with a column parallel cyclic analog-to-digital converter, the time available to convert one row is often several microseconds, whereas the resolution of the system clock is often in the 10 nanosecond region. This makes it possible to scale the duration of each phase of the conversion FIG. 7 illustrates example implementations of random capacitor selection in two MDACs 510, 610 performed in accordance with embodiments disclosed herein. The first MDAC 510 contains capacitors 530, 532, 534 and 536 and amplifier 540. The capacitors 530, 532, 534 and 536 have capacitances $C_1$, $C_2$, $C_3$, and $C_4$, respectively. In the phase 0 MDAC $510_0$ configuration, capacitors 530, 532, 534 and 536 are connected in parallel in a feedback configuration between the amplifier's 540 negative input terminal and its output Vco. Analog voltage Vs is initially sampled on capacitors 530, 532, 534 and 536.

The transition to phase 1 (arrow A) causes the capacitors 530, 532, 534 and 536 to be rearranged (discussed above). In the illustrated embodiment, however, the configurations can be in accordance with the capacitance combinations illustrated in table 551. That is, MDAC $510_1$ shows capacitances $C_A$, $C_B$, $C_C$, and $C_D$, which can have any of the combinations of capacitances $C_1$, $C_2$, $C_3$, $C_4$ (from phase 0) shown in table 551. The transition to phase 2 (arrow B) causes the capacitors 530, 532, 534 and 536 to be rearranged (discussed above). In the illustrated embodiment, the configurations can be in accordance with the capacitance combinations illustrated in table 553. That is, MDAC $510_2$ shows capacitances $C_E$, $C_F$, $C_G$, and $C_H$, which can have any of the combinations of capacitances $C_A$, $C_B$, $C_C$, $C_D$ (from phase 1) shown in table 553.

The transition to phase 3 (arrow C) causes the capacitors 530, 532, 534 and 536 to be rearranged (discussed above). In the illustrated embodiment, the configurations can be in accordance with the capacitance combinations illustrated in table 555. That is, MDAC $510_3$ shows capacitances $C_I$, $C_J$, $C_K$, and $C_L$, which can have any of the combinations of capacitances $C_E$, $C_F$, $C_G$, $C_H$ (from phase 2) shown in table 555. The transition back to phase 2 (arrow D) causes the capacitors 530, 532, 534 and 536 to be rearranged (discussed above). In the illustrated embodiment, the configurations can be in accordance with the capacitance combinations illustrated in table 557. That is, MDAC $510_2$ shows capacitances $C_E$, $C_F$, $C_G$, $C_H$, which can have any of the combinations of capacitances $C_I$, $C_J$, $C_K$, and $C_L$ (from phase 3) shown in table 557.

The second MDAC 610 contains capacitors 630, 632, 634 and 636 and amplifier 640. The capacitors 630, 632, 634 and 636 have capacitances $C_1$, $C_2$, $C_3$, and $C_4$, respectively. In the phase 0 MDAC $610_0$ configuration, capacitors 630, 632, 634 and 636 are connected in parallel in a feedback configuration between the amplifier's 640 negative input terminal and its output Vco. Analog voltage Vs is initially sampled on capacitors 630, 632, 634 and 636.

The transition to phase 1 (arrow A) causes the capacitors 630, 632, 634 and 636 to be rearranged (discussed above). In the illustrated embodiment, the configurations can be in accordance with the capacitance combinations illustrated in table 651. That is, MDAC $610_1$ shows capacitances $C_A$, $C_B$, $C_C$, and $C_D$, which can have any of the combinations of capacitances $C_1$, $C_2$, $C_3$, $C_4$ (from phase 0) shown in table 651. The transition to phase 2 (arrow B) causes the capacitors 630, 632, 634 and 636 to be rearranged (discussed above). This embodiment reflects the three capacitor alternative embodiment discussed above with reference to FIG. 6. Thus, in the illustrated embodiment, the configurations can be in accordance with the capacitance combinations illustrated in table 653. That is, MDAC $610_2$ shows capacitances $C_E$, $C_F$, $C_G$, and $C_H$, which can have any of the combinations of capacitances $C_A$, $C_B$, $C_C$, $C_D$ (from phase 1) shown in table 653.

The transition to phase 3 (arrow C) causes the capacitors 630, 632, 634 and 636 to be rearranged (discussed above). In the illustrated embodiment, the configurations can be in accordance with the capacitance combinations illustrated in table 655. That is, MDAC $610_3$ shows capacitances $C_I$, $C_J$, $C_K$, and $C_L$, which can have any of the combinations of capacitances $C_E$, $C_F$, $C_G$, $C_H$ (from phase 2) shown in table 655. The transition back to phase 2 (arrow D) causes the capacitors 630, 632, 634 and 636 to be rearranged (discussed above). In the illustrated embodiment, the configurations can be in accordance with the capacitance combinations illustrated in table 657. That is, MDAC $610_2$ shows capacitances $C_E$, $C_F$, $C_G$, $C_H$, which can have any of the combinations of capacitances $C_I$, $C_J$, $C_K$, and $C_L$ (from phase 3) shown in table 657.

Figure 8:
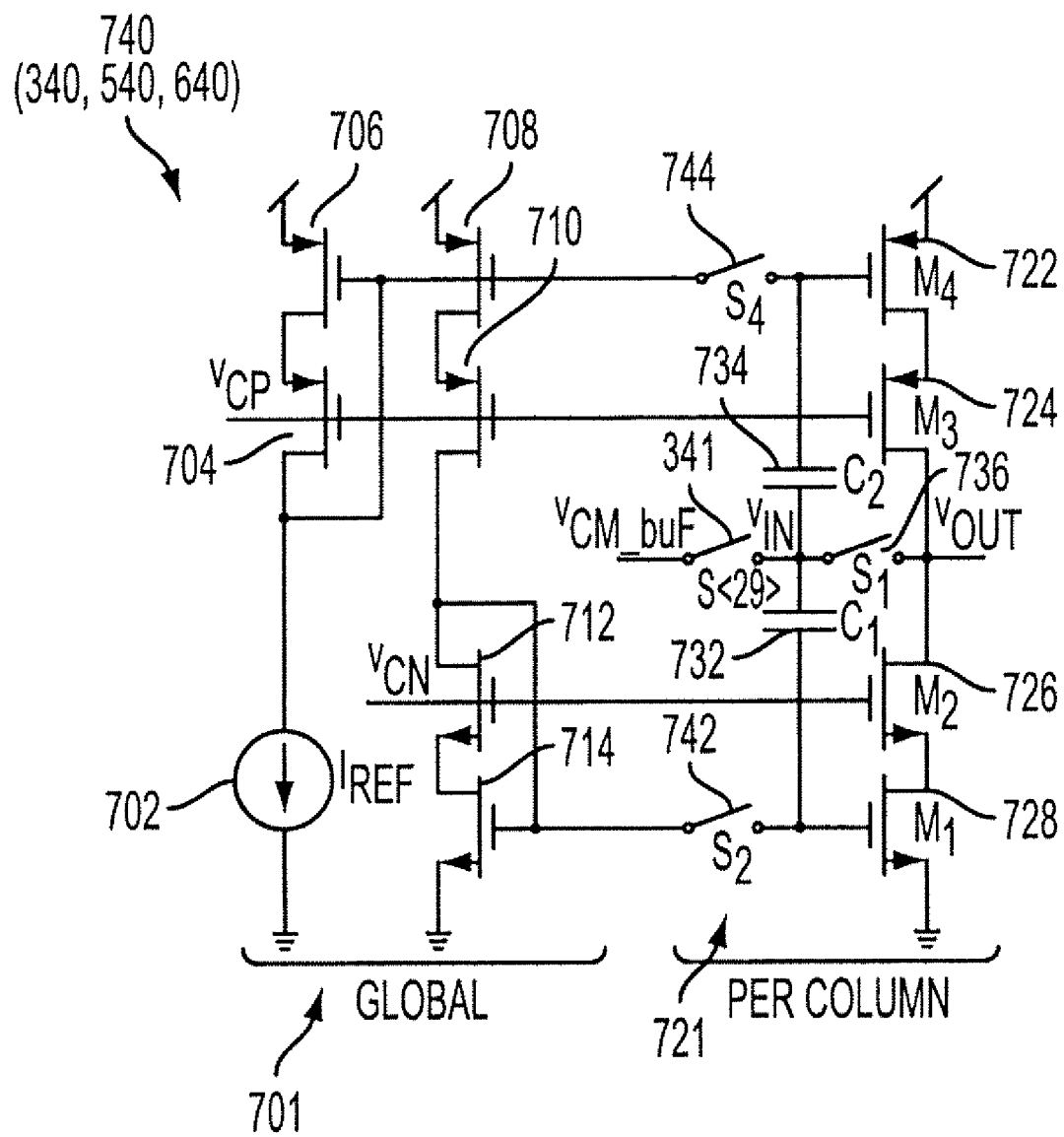
FIG. 8 illustrates an example amplifier circuit that may be used in the FIG. 5 cyclic analog-to-digital converter constructed in accordance with an embodiment disclosed herein.

FIG. 8 illustrates an example amplifier circuit 740 that may be used in the FIG. 5 cyclic analog-to-digital converter 300 or the MDACs 510, 610 illustrated in FIG. 7. The circuit 740 includes a global portion 701 and a per column portion 721. The global portion 701 comprises a reference current source 702 supplying a reference current $I_{REF}$, four p-channel transistors 704, 706, 708, 710 and two n-channel transistors 712, 714. The global portion 701 is connected to the per column portion 721 via switches 742, 744 (respectively controlled by signals $S_2$ and $S_4$). The per column portion 721 comprises two capacitors 732, 734 (respectively having capacitances $C_1$, $C_2$), two switches 341, 736 (respectively controlled by signals s<29> and $S_1$), two n-channel transistors 726, 728 and two p-channel transistors 722, 744. $V_{CM\_BUF}$ is connected to the per column portion 721 and serves as the input voltage $V_{IN}$ when switch 341 is closed. $V_{OUT}$ is the amplifier output (e.g., $V_O$). The gates of transistors 712 and 726 are connected to voltage $V_{CN}$. The gates of transistors 704, 710, and 724 are connected to voltage $V_{CP}$.

The amplifier 740 is a single branch class AB amplifier and has two modes of operations: a reset mode, to set the bias current and common mode voltage, and an amplifying mode, when it operates as an amplifier. The benefits of using this amplifier 740 include e.g., rail to rail output, high gain, not slew-rate limited (class AB output), low power (only one current branch => maximum gain for a given bias current). The lone drawback is the poor high frequency power supply rejection ratio (PSRR only 6 dB). For frequencies well below the inverse of the reset frequency, the PSRR is, however, excellent.

Figure 9:
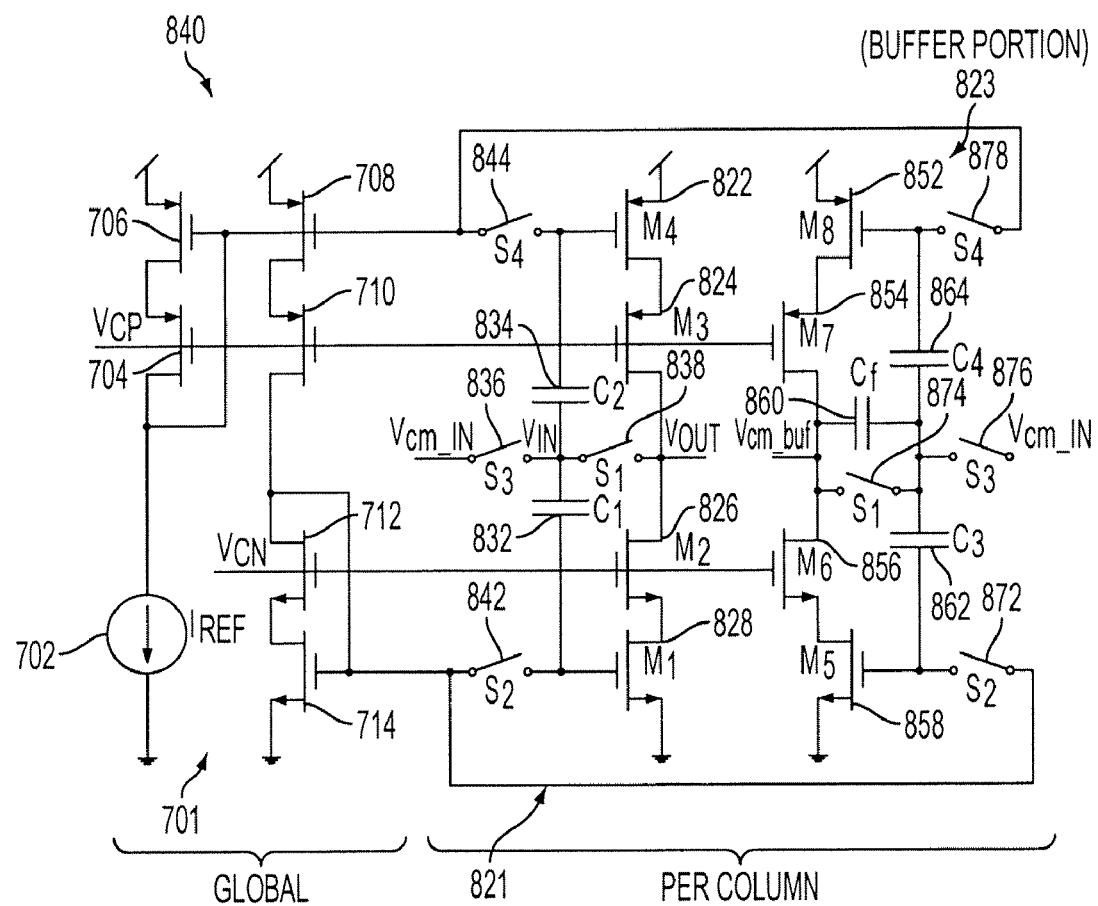
FIG. 9 illustrates another example amplifier circuit that may be used in the FIG. 5 cyclic analog-to-digital converter constructed in accordance with an embodiment disclosed herein.

FIG. 9 illustrates another example amplifier circuit 840 that may be used in the FIG. 5 cyclic analog-to-digital converter 300 preferably in conjunction with amplifier 740 (FIG. 8). The amplifier circuit 840 is also a class AB amplifier and includes a global portion 701, which is the same as the portion 701 described above with respect to FIG. 7, and a per column portion 821. The global portion 701 is connected to the per column portion 821 via switches 842, 844 (respectively controlled by signals $S_2$ and $S_4$). The per column portion 821 comprises five capacitors 832, 834, 860, 862, 864 (respectively having capacitances $C_1$, $C_2$, $C_f$, $C_3$, $C_4$), Six switches 836, 838, 872, 874, 876, 878 (respectively controlled by signals $S_3$, $S_1$, $S_2$, $S_1$, $S_3$, $S_4$), n-channel transistors 826, 828, 856, 858 and p-channel transistors 822, 824, 852, 854. Transistors 852, 854, 856, 858, 872, 876 and 878 and capacitors 860, 862 and 864 comprise a buffer portion 823 of portion 821. Vcm_in is connected to the per column portion 821 and serves as the input voltage $V_{IN}$ when switch 836 is closed. $V_{OUT}$ is one output while $V_{CM\_BUF}$ is a buffered output of the input Vcm.

The FIG. 9 amplifier 840 is designed to improve the poor high frequency PSRR of the amplifier 740 illustrated in FIG. 8. The principle is to mimic the transfer function from the power supply to the amplifier output for both the amplifier Vout and the common mode buffer that sets up the local zero level (i.e., $V_{CM\_BUF}$). There is no additional cost to add this buffer since the common mode buffer is already implemented locally per column. The high frequency power supply noise added to $V_{OUT}$ and $V_{CM\_BUF}$ in is highly correlated (a question of matching) so the PSRR for signal used $V_{OUT}$-$V_{CM\_BUF}$ will be high, even for high frequencies. This amplifier 840 has all the benefits of amplifier 740 with the added ability to suppress high frequency power supply noise.

Figure 10:
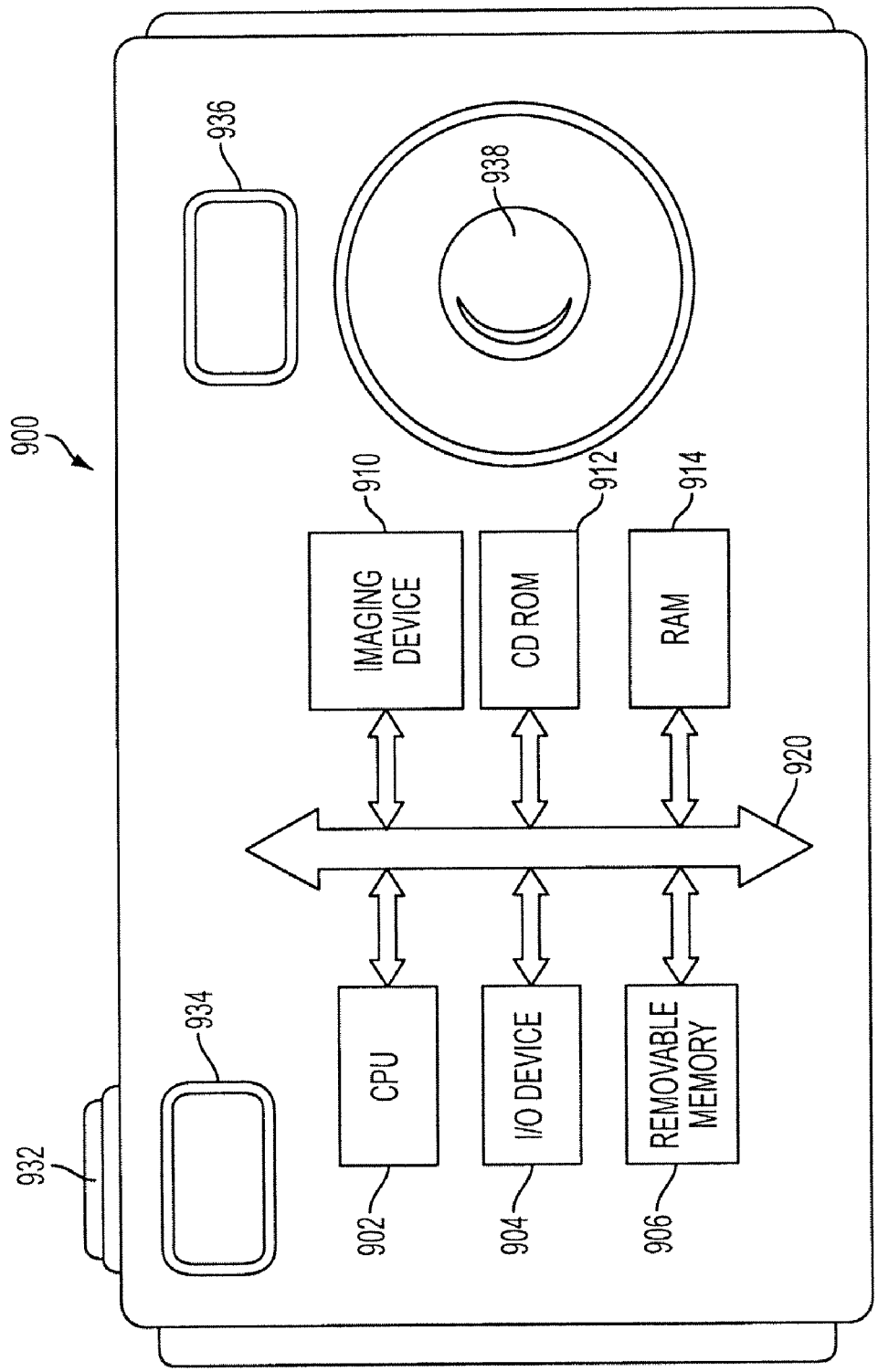
FIG. 10 shows a processor system incorporating at least one imaging device constructed in accordance with an embodiment disclosed herein.

FIG. 10 shows a processor system 900 incorporating at least one imaging device 910 constructed and operated in accordance with an embodiment disclosed herein. The processor system 900 could, for example be a camera system comprising a shutter release button 932, a view finder 934, a flash 936 and a lens system 938 for focusing an image on the pixel array of the imaging device 910. The system 900 generally also comprises a central processing unit (CPU) 902, for example, a microprocessor for controlling functions and which communicates with one or more input/output devices (I/O) 904 over a bus 920. The CPU 902 also exchanges data with random access memory (RAM) 914 over the bus 920, typically through a memory controller. The camera system may also include peripheral devices such as a removable memory 906, which also communicates with CPU 902 over the bus 920. In the case of a computer system, the system 900 could also include a CD ROM drive 912. Other processor systems which may employ imaging devices 910 besides cameras, include computers, PDAs, cell phones, scanners, machine vision systems, and other systems requiring imaging applications.

The above description and drawings illustrate various embodiments It should be appreciated that modifications, though presently unforeseeable, of these embodiments that can be made without departing from the spirit and scope of the invention which is defined by the following claims.

What is claimed as new and desired to be protected by Letters Patent of the United States is:

1. A single stage cyclic analog-to-digital converter having an N-bit resolution and performing N conversion phases, the converter comprising:
   a multiplying circuit for performing a multiplication operation during the conversion phases on analog input signals, the multiplying circuit generating an analog output signal; and
   a sub-analog-to-digital converter connected to receive the analog output signal from the multiplying circuit, the sub-analog-to-digital converter for converting, during the conversion phases, the analog output signal into portions of an N-bit digital code, the sub-analog-to-digital converter for outputting the portions of the digital code to the multiplying circuit,
   the multiplying circuit switching configurations between conversion phases and using the portions of the digital code during the conversion phases to generate new analog output signals for subsequent conversion by the sub-analog-to-digital converter.

2. The cyclic analog-to-digital converter of claim 1 further comprising an input circuit for inputting an analog pixel signal to be converted into the N-bit digital code during an initial operational phase.

3. The cyclic analog-to-digital converter of claim 2, wherein the input circuit comprises a plurality of storage elements switchably coupled between an input of the multiplying circuit and the analog pixel signal and switchably coupled between the input of the multiplying circuit and the analog output signal.

4. The cyclic analog-to-digital converter of claim 1, wherein the multiplying circuit generates new analog output signals by performing a multiplication operation of a prior analog output signal and subtracting an analog voltage generated using the portions of the digital code from a prior conversion phase.

5. The cyclic analog-to-digital converter of claim 1, wherein the multiplying circuit comprises:
   a switched capacitor circuit for storing the analog input and output signals; and
   an amplifier having an input and an output switchably connected to the switched capacitor circuit, wherein the output of the amplifier is analog output signal.

6. The cyclic analog-to-digital converter of claim 5, wherein the multiplying circuit switches configurations between conversion phases by changing capacitor connections within the switched capacitor circuit such that one of a plurality of different capacitor combinations sample and hold the analog output signal.

7. The cyclic analog-to-digital converter of claim 5, wherein the multiplying circuit switches configurations between conversion phases by changing capacitor connections within the switched capacitor circuit such that one of a plurality of different capacitor combinations sample and hold the analog output signal,
   wherein at least one capacitor combination uses less than all capacitors in the switched capacitor circuit.

8. The cyclic analog-to-digital converter of claim 5, wherein the multiplying circuit switches configurations between conversion phases by randomly changing capacitor connections within the switched capacitor circuit such that one of a plurality of different capacitor combinations sample and hold the analog output signal.

9. The cyclic analog-to-digital converter of claim 5, wherein the amplifier is a single branch class AB amplifier having a reset mode and an amplifying mode.

10. The cyclic analog-to-digital converter of claim 1, further comprising a common mode voltage buffering circuit having a single branch class AB amplifier for providing a buffered common mode voltage to the sub-analog-to-digital converter.

11. The cyclic analog-to-digital converter of claim 1, wherein the conversion phases are optimized such that each phase minimizes power consumption for a known noise and conversion time.

12. An imager comprising:
   an array of pixels organized into a plurality of rows and columns;
   readout circuitry connected to the columns of the array, the readout circuitry sampling and holding analog reset signals and image signals output from the columns, the readout circuitry having a plurality of analog outputs, each output corresponding to a column of the array; and
   a plurality of cyclic analog-to-digital converters, each analog-to-digital converter connected to and associated with an analog output of the readout circuitry, each analog-to-digital converter having an N-bit resolution and performing N conversion phases, each analog-to-digital converter comprising:
     first and second switched capacitor circuits, the first switched capacitor circuit for sampling the respective analog output from the readout circuitry and for performing a multiplication operation during the conversion phases on processed analog signals received from the second switched capacitor circuit, the second switched capacitor circuit being connected to receive multiplied analog signals from the first switched capacitor circuit and for converting, during the conversion phases, the multiplied analog signals into portions of an N-bit digital code,
     wherein the first switched capacitor circuit switches capacitor circuit configurations between one of at least three conversion capacitor circuit configurations during conversion phases based on the portions of the N-bit digital code.

13. The imager of claim 12, wherein the conversion phases are optimized such that each phase minimizes power consumption for a known noise and conversion time.

14. The imager of claim 12, wherein each analog-to-digital converter further comprises an input circuit for inputting the respective analog output from the readout circuitry during an initial operational phase.

15. The imager of claim 14, wherein the input circuit comprises a plurality of storage elements switchably coupled between an input of the first switched capacitor circuit and the respective analog output from the readout circuitry and being switchably coupled between the input of the first switched capacitor circuit and a node receiving the multiplied analog signals.

16. The imager of claim 12, wherein the first switched capacitor circuit generates new multiplied analog signals by performing a multiplication operation of a prior multiplied analog signal and subtracting an analog voltage generated using the portions of the digital code from a prior conversion phase.

17. The imager of claim 12, wherein the first switched capacitor circuit switches configurations between conversion phases by changing capacitor connections such that one of a plurality of different capacitor combinations sample and hold the analog output signal.

18. The imager of claim 12, wherein the first switched capacitor circuit switches configurations between conversion phases by changing capacitor connections such that one of a plurality of different capacitor combinations sample and hold the analog output signal,
  wherein at least one capacitor combination uses less than all capacitors in the switched capacitor circuit.

19. The imager of claim 12, wherein the first switched capacitor circuit switches configurations between conversion phases by randomly changing capacitor connections changing capacitor connections such that one of a plurality of different capacitor combinations sample and hold the analog output signal.

20. The imager of claim 12, wherein the first switched capacitor circuit comprises an amplifier having an input and an output switchably connected to a plurality of capacitors of the first switched capacitor circuit.

21. The imager of claim 20, wherein the amplifier is a single branch class AB amplifier having a reset mode and an amplifying mode.

22. The imager of claim 12, wherein each cyclic analog-to-digital converter further comprises a common mode voltage buffering circuit having a single branch class AB amplifier for providing a buffered common mode voltage to the first and second switched capacitor circuits.

23. A method of performing a cyclic analog-to-digital conversion of an analog input signal into an N-bit digital code, the method comprising:
  sampling the analog input signal into a switched capacitor circuit;
  using the analog input signal to generate a first portion of the digital code and a modified analog signal;
  changing a configuration of the switched capacitor circuit to one of at least three capacitor configurations;
  multiplying the modified analog signal to generate a multiplied analog signal;
  based on the first portion of the digital code;
  generating a next portion of the digital code and another modified analog signal using the multiplied analog signal; and
  repeating the changing to generating steps until N conversion phases have been performed and all bits of the N-bit digital code are generated.

24. The method of claim 23, wherein the multiplying step generates the multiplied analog signal by performing a multiplication operation of a prior multiplied analog signal and subtracting an analog voltage generated using the portions of the digital code from a prior conversion phase.

25. The method of claim 23, wherein the step of changing a configuration of the switched capacitor circuit comprises randomly changing the capacitor configuration.

* * * * *